(12) United States Patent
Toosky

(10) Patent No.: US 6,208,278 B1
(45) Date of Patent: Mar. 27, 2001

(54) SYSTEM AND METHOD FOR LOGARITHMIC DIGITAL TO ANALOG CONVERSION

(75) Inventor: Zabih Toosky, Santa Cruz, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/306,886

(22) Filed: May 7, 1999

(51) Int. Cl.[7] .................................................... H03M 1/66
(52) U.S. Cl. ............................................................ 341/138
(58) Field of Search .................................... 341/136, 144, 341/118, 119, 145

(56) References Cited

U.S. PATENT DOCUMENTS

| | | |
|---|---|---|
| 4,558,242 | 12/1985 | Tuthill et al. . |
| 4,590,456 | 5/1986 | Burton et al. . |
| 5,258,757 | * 11/1993 | Reynolds .............................. 341/136 |
| 5,757,298 | 5/1998 | Manley et al. . |
| 5,841,384 | 11/1998 | Herman et al. . |

* cited by examiner

Primary Examiner—Brian Young

(57) ABSTRACT

The present invention relates to digital to analog conversion. According to an embodiment of the present invention, a logarithmic transfer characteristic may be produced by subtracting a fraction of the output current to a reference current in a recursive equation.

17 Claims, 5 Drawing Sheets

SYSTEM AND METHOD FOR LOGARITHMIC DIGITAL TO ANALOG CONVERSION

FIELD OF THE INVENTION

The present invention relates to electronic circuits. In particular, the present invention relates to digital to analog conversion for electric circuits.

RELATED APPLICATIONS

The present invention is related to a concurrently filed patent application, entitled SYSTEM AND METHOD FOR EXPONENTIAL DIGITAL TO ANALOG CONVERSION.

BACKGROUND OF THE INVENTION

Digital to analog conversion is a process in which signals having a few (typically two) defined levels or states are converted into signals having quantized analog states. The number of quantization states is typically equal to two to the power of digitized input bits. For example, if there are four digitized input bits, then there will typically be $2^4$ different quantized analog states. A digital signal typically has two states: zero and one. Analog signals theoretically have infinite number of states and conveys data as electronic signals of varying frequency or amplitude that may be added to carrier waives of a given frequency. An example of a digital to analog conversion is the processing by a modem of computer data into audio frequency tones that can be transmitted over a telephone line. The circuit that performs this function is typically referred to as a digital to analog converter (DAC). Binary digital impulses typically appear as long strings of ones and zeros that typically have no apparent meaning to a human observer. However, when a DAC is used to decode the binary digital signals, meaningful output can appear. Examples of these outputs include voice, picture, musical tone or mechanical motion.

The transfer characteristics of DACs are typically linear. However, there may be some applications that require nonlinear transfer characteristics. For example, it may be desirable to compress data when a signal is large and not compress data in the remaining signal.

It would be desirable to have an integrated circuit that provides nonlinear transfer characteristics of a DAC. The present invention addresses such a need.

SUMMARY OF THE INVENTION

The present invention relates to digital to analog conversion. According to an embodiment of the present invention, a logarithmic transfer characteristic may be produced by subtracting a fraction of the output current from a reference current in a recursive equation.

A system for a digital to analog conversion according to an embodiment of the present invention is presented. The system comprises a digital to analog conversion circuit, and a node coupled to the digital to analog conversion circuit, wherein a fraction of an output current is subtracted from a reference current at the node.

A method for a digital to analog conversion according to an embodiment of the present invention is also presented. The method comprises providing a reference current; providing an output current; and subtracting a fraction of the output current from the reference current.

DETAILED DESCRIPTION OF THE PREFERRED EMBODIMENTS

The following description is presented to enable one of ordinary skill in the art to make and to use the invention and is provided in the context of a patent application and its requirements. Various modifications to the preferred embodiments will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
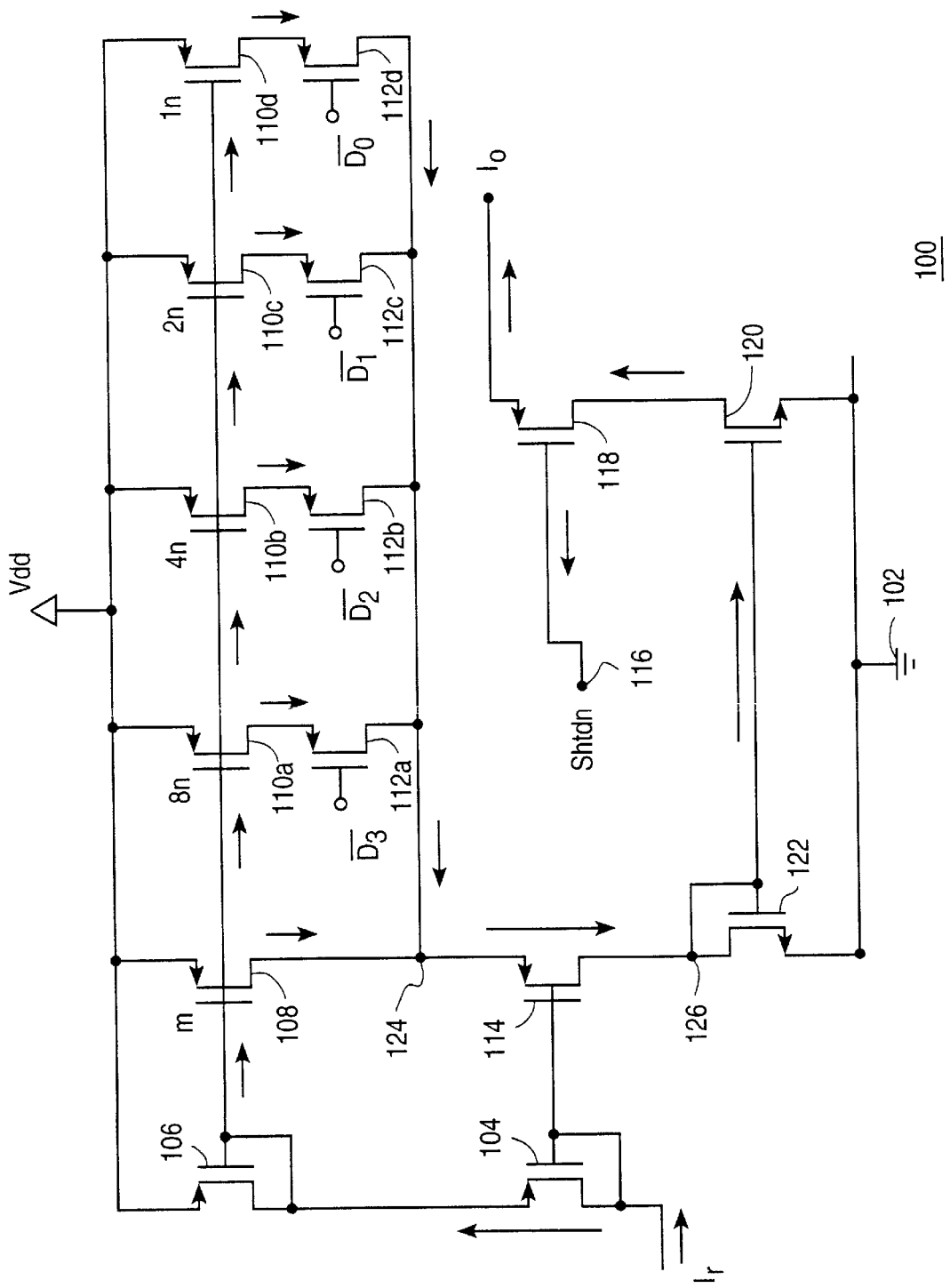
FIG. 1 is a schematic diagram of an example of a linear circuit DAC.

FIG. 1 is a schematic diagram of an example of a linear DAC 100. In this example, a reference current ($I_r$) enters circuit 100 and flows through transistor 104. Transistor 104 provides gate voltage to cascode device 114 and passes the reference current to transistor 106. The current then flows through transistors 108, 110A–110D. At transistor 108, the reference current is scaled by a ratio of transistor size width over length (W over L) of transistor 108 to transistor 106. At transistor 110A, the reference current is scaled by eight times the ratio of width over length of transistor 110A to transistor 106. At transistor 110B, the reference current is scaled by four times the ratio of W over L of transistor 110B to transistor 106. At transistor 110C, the reference current is scaled by two times the ratio of W over L of transistor 110C to transistor 106. Likewise, at transistor 110D, the reference current is scaled by one times the ratio of W over L of transistor 110D to transistor 106.

Each of these transistors 108 and 110A–110D may act as a current source. Transistors 112A–112D may act as switches wherein the states of the switches depend on a binary input code. Accordingly, some, none, or all of the current flowing through transistors 108 and 110A–110D may flow through transistors 112A–112D, depending on which transistors 112A–112D are switched on. The current that is allowed to pass through switches 112A–112D is then summed at node 124.

Thereafter, the summed current flows through transistor 114 which acts as a cascode device that isolates the summing node 124 from drain node 126 so that both nodes 124 and 126 can have a compliance voltage without substantially affecting each other.

After transistor 114, the current flows through current mirrors 122 and 120. Then the current flows into transistor 118. Transistor 118 may be shut down at node 116 when the logic level is high, and produce the output current when the logic level is low.

For a linear current DAC, such as the DAC 100 shown in FIG. 1, the output current may be described as follows:

$$I_0 = I_r M + I_r (D + 2D_1 + 4D_2 + 8D_3) N$$

Wherein $I_0$ is the output current; $I_r$ is the reference current; $D_0$–$D_3$ indicate current (if any) flowing through transistors 112A–112D; M=the transistor size W over L of transistor 108 to transistor 106; and N=ratio of current sources to the reference current. Examples of N include ratio of width over length of transistor 110a to transistor 106; transistor 110b to transistor 106; transistor 110c to transistor 106; and transistor 110d to transistor 106.

Although such a linear DAC may work well for many applications, there may be some applications that require nonlinear transfer characteristics. For example, it may be desirable to compress data when a signal is large and not compress data in the remaining signal. It would be desirable to have an integrated circuit that provides nonlinear transfer characteristics of a DAC. The present invention addresses such a need.

Figure 2:
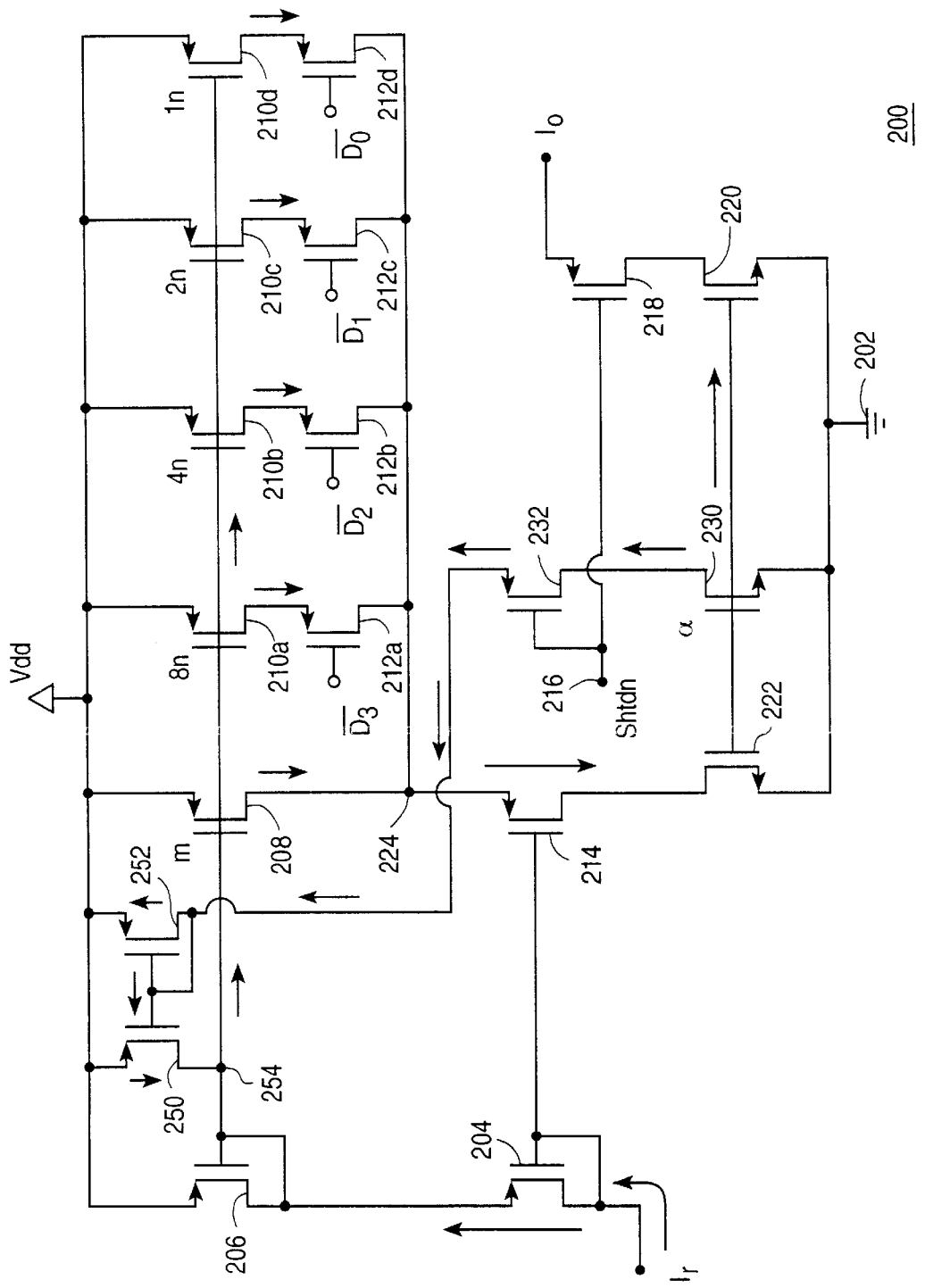
FIG. 2 is a schematic diagram of a logarithmic DAC according to an embodiment of the present invention.

FIG. 2 is a schematic diagram of a logarithmic DAC 200 according to an embodiment of the present invention. In this embodiment, a reference current ($I_r$) enters circuit 200 and flows through transistor 204. Transistor 204 provides a gate voltage to a cascode device 214 and passes the reference current to transistor 206. The current then flows through transistors 208 and 210A–210D. At transistor 208, the reference current is scaled by a ratio of transistor size width over length of transistor 208 to transistor 206. At transistor 210A the reference current is scaled by eight times the ratio of width over length (W over L) of transistor 210A to transistor 206. At transistor 210B, the reference current is scaled by four times the ratio of W over L of transistor 210B to transistor 206. At transistor 210C, the reference current is scaled by two times the ratio of W over L of transistor 210C to transistor 206. Likewise, at transistor 210D the reference current is scaled by one times the ratio of W over L of transistor 210D to transistor 206.

Each of these transistors 208 and 210A–210D act as a current source. Transistors 212A–212D act as switches where the states of the switches depend on a binary input code. Accordingly, some, none, or all of the current flowing through transistors 208 and 210A–210D may flow through transistors 212A–212D, depending on which transistors 212A–212D are switched on.

The current that is allowed to pass through switches 212A–212D is summed at node 224. $I_0$ is formed after the summing node 224. Thereafter, the summed current flows through transistor 214 which acts as a cascode device to isolate the summing node 224 from the drain of transistor 222 so that both node 224 and drain of transistor 222 may have a compliance voltage without substantially affecting each other.

After transistor 214, the current flows through transistor 222 which mirrors the current at transistor 220. A fraction of the current is also mirrored through transistor 230. The fraction of the current that is mirrored is indicated as α. The current 10 through transistor 222 is mirrored to 220 to form $I_0$, while the fraction (α) of the current through transistor 222 is mirrored to transistor 230 and flows up to transistor 252. The current at transistor 252, which is a fraction of the output current ($\alpha I_0$), is mirrored at transistor 250. At node 254, the fraction of the output current is summed with $I_r$ to result in a recursive equation describing the current flow.

Examples of a type of transistors for transistors 222, 230, and 220 include NMOS transistors, while examples of the type of transistors for the rest of the transistors shown in the logarithmic DAC 200 may be PMOS transistors.

After the current is mirrored through transistors 222 and 220, the current flows through transistor 218 which may be shut down at node 216. For example, when the logic level is high, the current flow may be shut down at node 216, and output the output current when the logic level is low.

For a logarithmic DAC according to an embodiment of the present invention, such as the DAC 200 shown in FIG. 2, the output current may be described as follows:

$$I_0=(I_r-\alpha I_0)M+(I_r-\alpha I_0)(D_0+2D_1+4D_2+8D_3)N$$

Wherein α is a small fraction of the output current; $I_0$ is the output current; $I_r$ is a reference current; and M is an offset coefficient. In this example, α is the ratio of the size of width over length (W/L) of transistor 220 to transistor 230. For example, $(W_{220}/L_{220})/(W_{230}/L_{230})=W_{220}L_{230}/L_{220}W_{230}=\alpha$. An example of α is 1/16. An example of the reference current is ten microns. $D_0$ through $D_3$ indicate current (if any) flowing through transistors 212A–212D; M=the transistor size W over L of transistor 208 to transistor 206; and N=N=ratio of current sources to the reference current. Examples of N include ratio of width over length of transistor 210a to transistor 206; transistor 210b to transistor 206; transistor 210c to transistor 206; and transistor 210d to transistor 206.

To see the logarithmic functionality of the current, the equation may be converted into the following:

$$I_0=MI_r-\alpha MI_0+KI_r-\alpha KI_0, \text{ wherein } K=N(D_0+2D_1+4D_2+8D_3)$$

$$I_0(1+\alpha(M+K))=I_r(M+K)$$

$$I_0=(I_r(M+K))/(1+\alpha(M+K)),$$

which can be compared to the standard logarithmic form of $$Y=(AX/(1+BX)).$$

Figure 3:
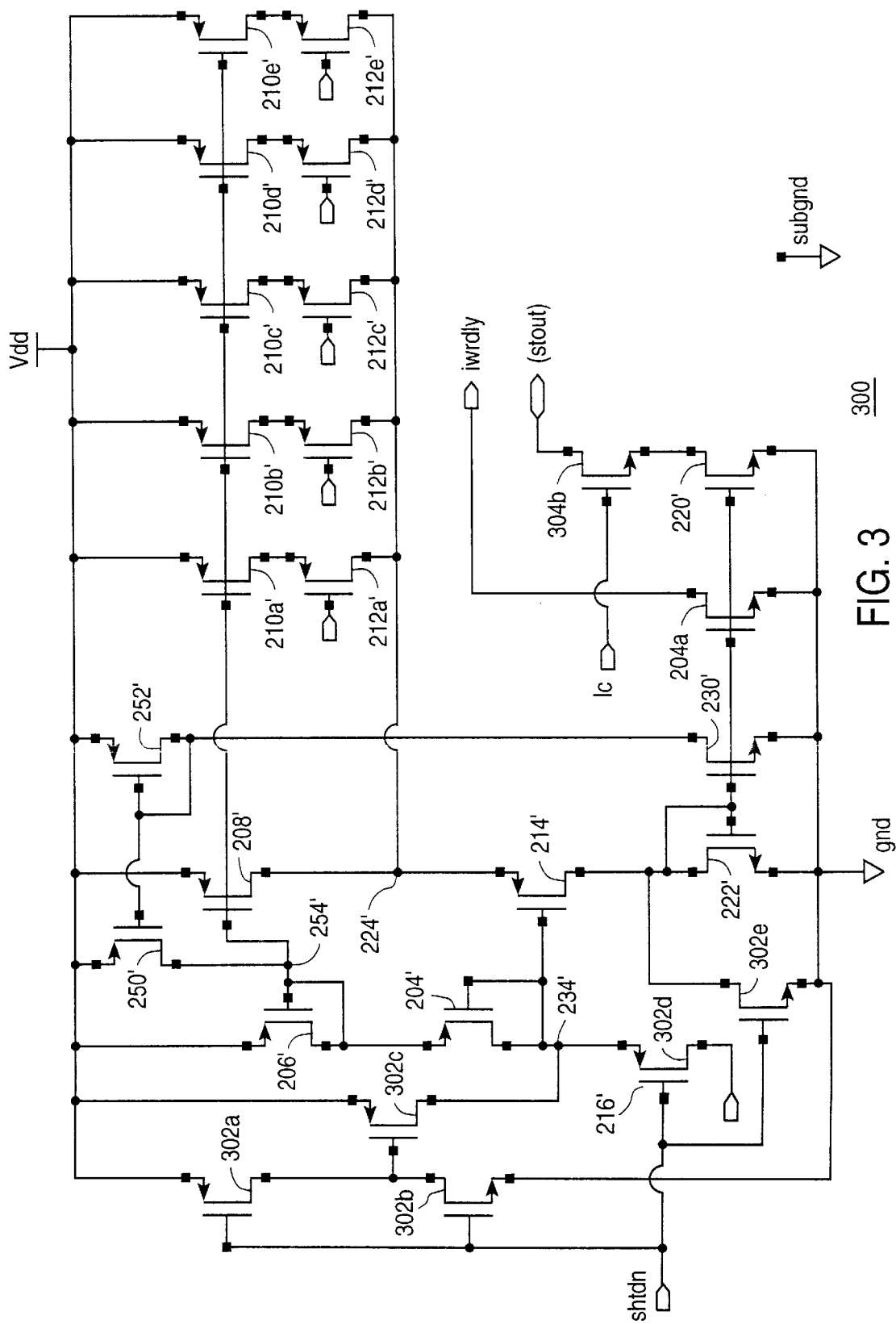
FIG. 3 is another schematic diagram of a logarithmic DAC according to an embodiment of the present invention.

FIG. 3 is a schematic diagram of a logarithmic DAC circuit according to another embodiment of the present invention. In this embodiment, the logarithmic DAC circuit 300 is shown to include all of the components previously described in the embodiment shown in FIG. 2 with the addition of shut down transistors 302A–302E and additional transistors 304A–304B used for test purposes. Additionally, example of the logarithmic DAC 300 is also shown to include additional transistors 210E and 212E to provide a circuit with five bits rather than four bits of input code. The number of transistors 210 and 212, and therefore the number of bits, are configurable upon the needs of the designer. For example, the input code may have two to twenty-four bits.

Figure 4:
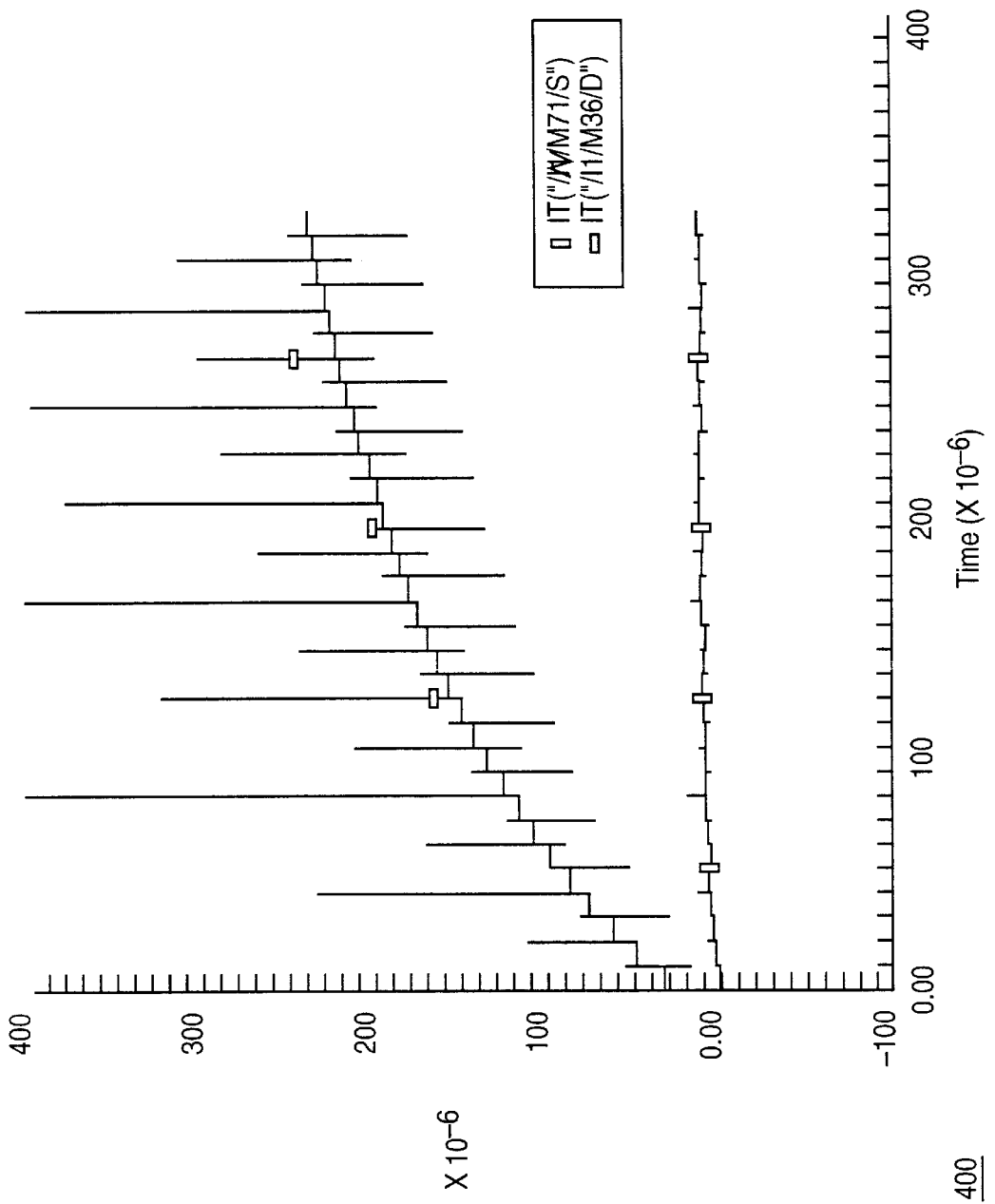
FIG. 4 is a graph of an example of the transfer characteristics of the logarithmic DAC according to an embodiment of the present invention.

FIG. 4 is a chart showing an example of the transfer characteristics of the logarithmic DAC according to an embodiment of the present invention. The chart of FIG. 4 plots $I_0$ vs. input code. The input code is a binary number which is typically a function of time since the input code is incremented in fixed time increments. Examples of $I_0$ ranges include 35 to 243 which may be a fast batch of integrated circuits (IC's); 32 to 238 which may be a typical batch of IC's; and 30 to 235 which may be a slow batch of IC's. As shown by the curvature of the graph, the transfer characteristics of the logarithmic DAC according to an embodiment of the present invention is non-linear and approximates a logarithmic shape.

Figure 5:
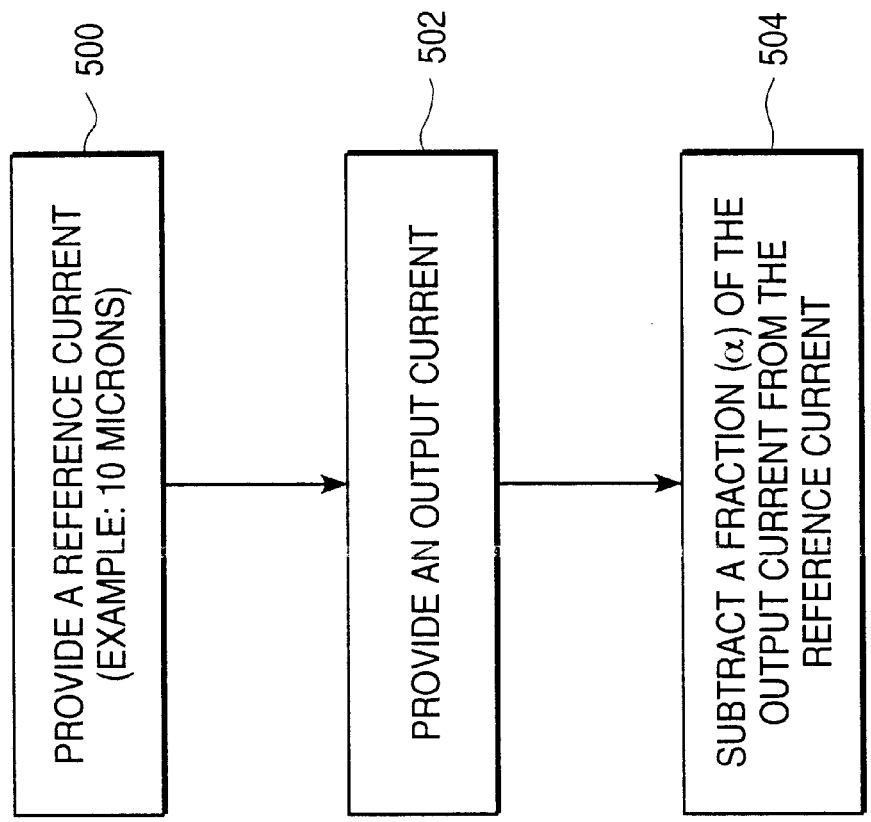
FIG. 5 is a flow diagram of an example of a method according to an embodiment of the present invention for a digital to analog conversion.

FIG. 5 is a flow diagram of an example of a method according to an embodiment of the present invention for a digital to analog conversion. A reference current, such as ten microns, is provided (step 500). An output current is also provided (step 502). A fraction (α) of the output current is then subtracted from the reference current (step 504).

Although the present invention has been described in accordance with the embodiment shown, one of ordinary skill in the art will readily recognize that there could be variations to the embodiment and these variations would be within the spirit and scope of the present invention. Accordingly, many modifications may be made by one of ordinary skill in the art without departing from the spirit and scope of the appended claims.

What is claimed is:

1. A system for a digital to analog conversion, comprising:
a digital to analog conversion circuit; and
a node coupled to the digital to analog conversion circuit, wherein a fraction of an output current is subtracted from a reference current at the node to provide a nonlinear transfer characteristic.

2. The system of claim 1, further comprising a transistor coupled with the node, wherein a fraction of the output current passes through the transistor.

3. The system of claim 1, wherein the transfer characteristic of the digital to analog conversion is approximately logarithmic.

4. The system of claim 1, wherein the fraction is a ratio of the size of width over length (W/L) of a first transistor to a second transistor.

5. The system of claim 1, wherein the reference current is ten microns.

6. The system of claim 1, further comprising a first transistor and a second transistor, wherein the fraction of the output current is mirrored from the first transistor to the second transistor.

7. A method for a digital to analog conversion comprising:
providing a reference current;
providing an output current; and
subtracting a fraction of the output current from the reference current, wherein the digital to analog conversion is intentionally nonlinear.

8. The method of claim 7, further comprising passing a fraction of the output current through a transistor.

9. The method of claim 7, wherein a transfer characteristic of the digital to analog conversion is approximately logarithmic.

10. The method of claim 7, wherein the fraction is a ratio of the size of width over length (W/L) of a first transistor to a second transistor.

11. The method of claim 7, wherein the reference current is ten microns.

12. The system of claim 1, wherein the system is configured according to the nonlinear transfer function to compress large signals more than other signals.

13. The system of claim 1, wherein the digital to analog conversion circuit, without the subtraction of the fraction of the output current from the reference current at the node, would provide a linear transfer characteristic.

14. The system of claim 1, wherein the fraction is $1/16$.

15. The system of claim 1, wherein the fraction is a constant.

16. The method of claim 7, wherein the digital to analog conversion compresses data when a signal is large and not otherwise.

17. The method of claim 7, wherein the fraction is a fixed fraction.

* * * * *